(12) United States Patent
Denney (10) Patent No.: US 11,500,007 B2
(45) Date of Patent: Nov. 15, 2022

(54) NUISANCE ARC FAULT CIRCUIT INTERRUPTER (AFCI) CIRCUIT BREAKER TRIPPING DIAGNOSTIC TOOL

(71) Applicant: Siemens Industry, Inc., Alpharetta, GA (US)

(72) Inventor: Adam Denney, Peachtree Corners, GA (US)

(73) Assignee: SIEMENS INDUSTRY, INC., Alpharetta, GA (US)

( * ) Notice: Subject to any disclaimer, the term of this patent is extended or adjusted under 35 U.S.C. 154(b) by 194 days.

(21) Appl. No.: 16/944,229

(22) Filed: Jul. 31, 2020

(65) Prior Publication Data

US 2021/0278453 A1    Sep. 9, 2021

Related U.S. Application Data

(60) Provisional application No. 62/985,940, filed on Mar. 6, 2020.

(51) Int. Cl.
*G01R 31/12* (2020.01)
*H02H 1/00* (2006.01)
*H02J 7/00* (2006.01)
*H02H 3/16* (2006.01)

(52) U.S. Cl.
CPC ..... *G01R 31/1209* (2013.01); *G01R 31/1272* (2013.01); *H02H 1/0015* (2013.01); *H02H 3/16* (2013.01); *H02J 7/0063* (2013.01)

(58) Field of Classification Search
CPC .... G01R 31/00; G01R 31/12; G01R 31/1209; G01R 31/1227; G01R 31/1263; G01R 31/1272; H02H 1/00; H02H 1/0007; H02H 1/0015; H02H 3/00; H02H 3/16; H02J 7/00; H02J 7/0063
USPC ........ 324/500, 537, 539, 541, 543, 544, 551
See application file for complete search history.

(56) References Cited

U.S. PATENT DOCUMENTS

| | | | |
|---|---|---|---|
| 7,864,492 B2* | 1/2011 | Restrepo | H02H 1/0015 361/42 |
| 8,023,235 B2* | 9/2011 | Bilac | H02H 3/33 361/42 |
| 2006/0194467 A1* | 8/2006 | Beasley | H01R 13/6641 439/339 |

FOREIGN PATENT DOCUMENTS

| | | | | |
|---|---|---|---|---|
| CN | 102934308 A | * | 2/2013 | ........... H02H 1/0015 |
| RU | 2576629 C2 | * | 3/2016 | ........... G01R 22/068 |

\* cited by examiner

*Primary Examiner* — Hoai-An D. Nguyen (57) ABSTRACT

An arc-like radio frequency (RF) noise detector device is configured to detect and display RF noise on a residential circuit branch that cause or contribute to an arc fault circuit interrupter (AFCI) circuit breaker tripping. It includes a power cord with a plug to connect to a receptacle on a branch circuit of the AFCI circuit breaker to detect RF noise. It further includes a RF noise coupling circuit to receive power from a power entry module and coupled to an Application Specific Integrated Circuit (ASIC) to generate a Received Signal Strength Indicator (RSSI) signal from the detected RF noise. It further includes a power supply, a signal display device configured to receive and display the RSSI signal on a display screen to determine nature of a breaker trip event or likelihood of the breaker trip event and a battery to power the signal display device.

20 Claims, 5 Drawing Sheets

NUISANCE ARC FAULT CIRCUIT INTERRUPTER (AFCI) CIRCUIT BREAKER TRIPPING DIAGNOSTIC TOOL

CROSS REFERENCE TO RELATED APPLICATIONS

This application claims priority from a provisional patent application of U.S. Ser. No. 62/985,940, filed Mar. 6, 2020, which is incorporated by reference herein in its entirety.

BACKGROUND

1. Field

Aspects of the present invention generally relate to a simple diagnostic or monitoring tool capable of troubleshooting nuisance tripping of an arc fault circuit interrupter (AFCI) circuit breaker.

2. Description of the Related Art

Residential arc fault circuit interrupter (AFCI) circuit breakers are generally designed to trip when they detect an arc, thus preventing a fire. These breakers work by detecting the RF noise generated on the power line by an arc. Some common household devices such as LED lights, microwaves, and power tools also generate similar RF noise. RF noise generated by these non-arc sources can sometimes cause unwanted tripping of our AFCI breakers, commonly called nuisance tripping. Residential AFCI circuit breaker nuisance tripping causes serious issues in terms of damaged reputation, lost revenue, and site visit costs. Troubleshooting AFCI nuisance tripping events usually requires an engineer as well as a licensed electrician to be on site where the nuisance tripping is occurring, which is costly and time consuming.

One method of troubleshooting AFCI nuisance tripping is by having an engineer and an electrician visit the client site, usually accompanied by a Sales representative that is working with the client. The electrician works under the direction of the engineer to install a modified AFCI test breaker in the site electrical panel. This test breaker is then connected to an oscilloscope to display any RF noise detected. The RF noise is evaluated to determine its severity and whether it is generated by an actual arc or by some appliance such as LED lighting or a power tool. This process is then repeated for the remaining AFCI branches in the electrical panel. If the client site is a hotel or apartment building, this process is repeated in multiple units, based on the reported AFCI trip events. This process, not including travel time, can take from four to sixteen hours, depending on the amount of AFCI breakers the client has installed. The equipment needed for this process costs in excess of $5,000.

Therefore, there is a need for a better way for troubleshooting AFCI nuisance tripping.

SUMMARY

Briefly described, aspects of the present invention relate to an arc noise monitor. The objective of the described invention is to alleviate the time and cost of troubleshooting AFCI nuisance tripping by allowing a sales or technical support personnel to perform an on-site evaluation to identify the cause of the AFCI trip events and possibly remedy the situation without the need for engineering or electrician involvement. An Arc Noise Monitor is a small diagnostic tool that, when connected to a 120V branch circuit, detects, analyzes, and displays detected arc-like RF noise to allow for fast and accurate diagnosis of AFCI trip events. This device has only two controls: Off/On and Pause. The device is turned on using the Off/On switch and can be paused using the Pause button to hold a waveform on the display. The device displays the waveform of the detected noise on an LCD screen. The amplitude of the detected noise is displayed on a three-digit display.

In accordance with one illustrative embodiment of the present invention, an arc-like radio frequency (RF) noise detector device is provided to detect and display RF noise on a residential circuit branch that cause or contribute to an arc fault circuit interrupter (AFCI) circuit breaker tripping. It comprises a power cord with a plug to connect to a receptacle on a branch circuit of the arc fault circuit interrupter (AFCI) circuit breaker to detect RF noise. It further comprises a RF noise coupling circuit to receive power from a power entry module and coupled to an Application Specific Integrated Circuit (ASIC) to generate a Received Signal Strength Indicator (RSSI) signal from the detected RF noise. It further comprises a power supply to receive power from the power entry module to power the ASIC. It further comprises a signal display device configured to receive and display the RSSI signal on a display screen to determine nature of a breaker trip event or likelihood of the breaker trip event. It further comprises a battery to power the signal display device.

In accordance with one illustrative embodiment of the present invention, an arc-like radio frequency (RF) noise detector device is provided to detect and display RF noise on a residential circuit branch that cause or contribute to an arc fault circuit interrupter (AFCI) circuit breaker tripping. It comprises a power cord with alligator clips to connect to wiring on a branch circuit of the arc fault circuit interrupter (AFCI) circuit breaker to detect RF noise. It further comprises a RF noise coupling circuit to receive power from a power entry module and coupled to an Application Specific Integrated Circuit (ASIC) to generate a Received Signal Strength Indicator (RSSI) signal from the detected RF noise. It further comprises a power supply to receive power from the power entry module to power the ASIC. It further comprises a signal display device configured to receive and display the RSSI signal on a display screen to determine nature of a breaker trip event or likelihood of the breaker trip event. It further comprises a battery to power the signal display device.

DETAILED DESCRIPTION

To facilitate an understanding of embodiments, principles, and features of the present invention, they are explained hereinafter with reference to implementation in illustrative embodiments. In particular, they are described in the context of a simple diagnostic or monitoring tool capable of troubleshooting nuisance tripping of an arc fault circuit interrupter (AFCI) circuit breaker. Embodiments of the present invention, however, are not limited to use in the described devices or methods.

The components and materials described hereinafter as making up the various embodiments are intended to be illustrative and not restrictive. Many suitable components and materials that would perform the same or a similar function as the materials described herein are intended to be embraced within the scope of embodiments of the present invention.

These and other embodiments of the arc noise monitor according to the present disclosure are described below with reference to FIGS. 1-10 herein. Like reference numerals used in the drawings identify similar or identical elements throughout the several views. The drawings are not necessarily drawn to scale.

Figure 1:
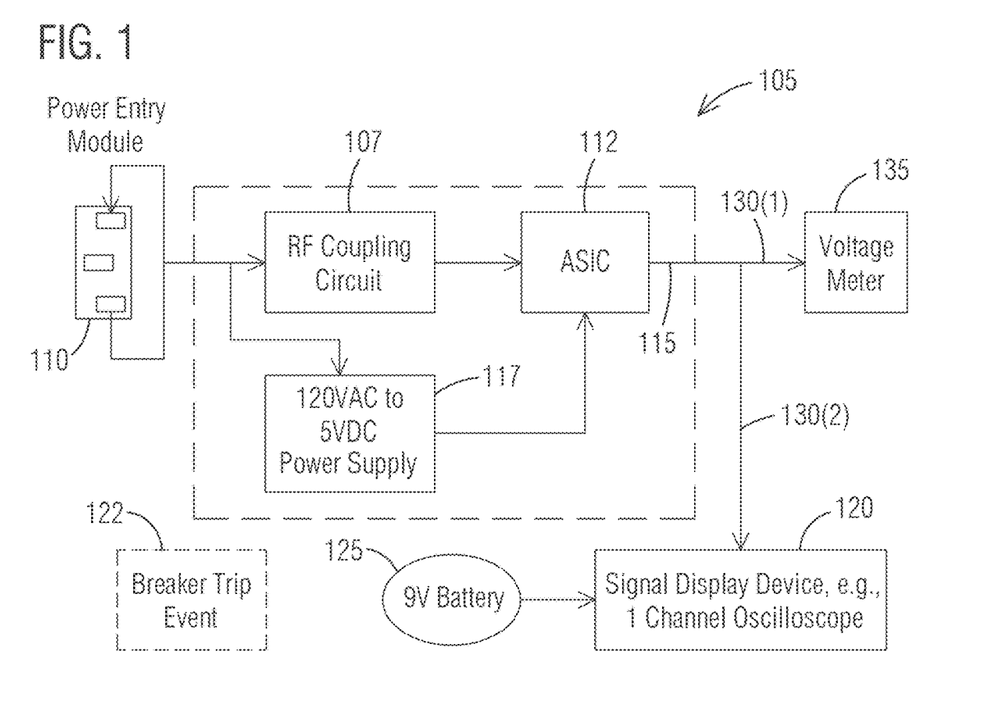
FIG. 1 illustrates a block diagram of an arc-like RF noise detector device to detect and display RF noise on a residential circuit branch that cause or contribute to AFCI circuit breaker tripping in accordance with an exemplary embodiment of the present invention.

Consistent with one embodiment of the present invention, FIG. 1 represents a block diagram of an arc-like RF noise detector device 105 or an Arc Noise Monitor in accordance with an exemplary embodiment of the present invention. The arc-like RF noise detector device 105 is configured to detect and display RF noise on a residential circuit branch that cause or contribute to AFCI circuit breaker tripping. The arc-like RF noise detector device 105 comprises a RF noise coupling circuit 107 to receive power from a power entry module 110 and coupled to an Application Specific Integrated Circuit (ASIC) 112 to generate a Received Signal Strength Indicator (RSSI) signal 115 from the detected RF noise. In one embodiment, the RF noise coupling circuit 107 is similar to that of a residential circuit breaker.

The arc-like RF noise detector device 105 further comprises a power supply 117 to receive power from the power entry module 110 to power the ASIC 112. The power supply 117 may be a 120V AC to 5V DC power supply. The RF noise coupling circuit 107, the ASIC 112 and the power supply 117 form a Combination Arc Fault Circuit Interrupter (CAFCI) RSSI circuit. A first output 130(1) of the ASIC 112 is coupled to a voltage meter 135.

The arc-like RF noise detector device 105 further comprises a signal display device 120 configured to receive and display the RSSI signal 115 on a display screen to determine nature of a breaker trip event 122 or likelihood of the breaker trip event 122. The signal display device 120 is a 1-channel oscilloscope to determine if the breaker trip event 122 is caused by an actual arc or by noise generated from a household appliance. The signal display device 120 may be a low cost 1-channel oscilloscope kit. A second output 130(2) of the ASIC 112 is coupled to the signal display device 120. The arc-like RF noise detector device 105 further comprises a battery 125 to power the signal display device 120. The battery 125 is capable of supplying 8V to 12V DC power. The battery 125 may be an AC to DC power supply capable of providing 8V to 12V DC power.

The arc-like RF noise detector device 105 further comprises a power cord with a plug (see FIG. 4) to connect to a receptacle on a branch circuit of the arc fault circuit interrupter (AFCI) circuit breaker to detect RF noise. Alternatively, the arc-like RF noise detector device 105 further comprises a power cord with alligator clips (see FIG. 5) to connect to wiring on a branch circuit of the arc fault circuit interrupter (AFCI) circuit breaker to detect RF noise.

Figure 3:
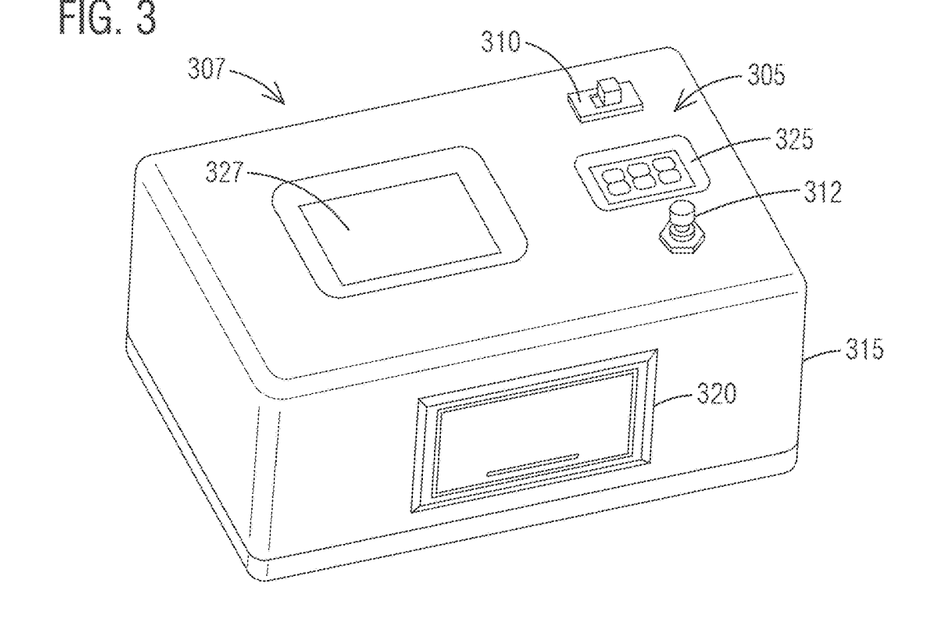
FIG. 3 illustrates a user interface of the arc-like RF noise detector device in accordance with an exemplary embodiment of the present invention.

The arc-like RF noise detector device 105 is powered using a 9V battery, which can be accessed by opening a battery compartment (seen in FIG. 3) on the front side of an enclosure (seen in FIG. 3). The arc-like RF noise detector device 105 is to be used by a Sales or Technical Support personnel. Applications include any public or private place where AFCI circuit breakers are installed. These places may include homes, both single and multifamily, places of business, commercial institutions, etc.

Figure 2:
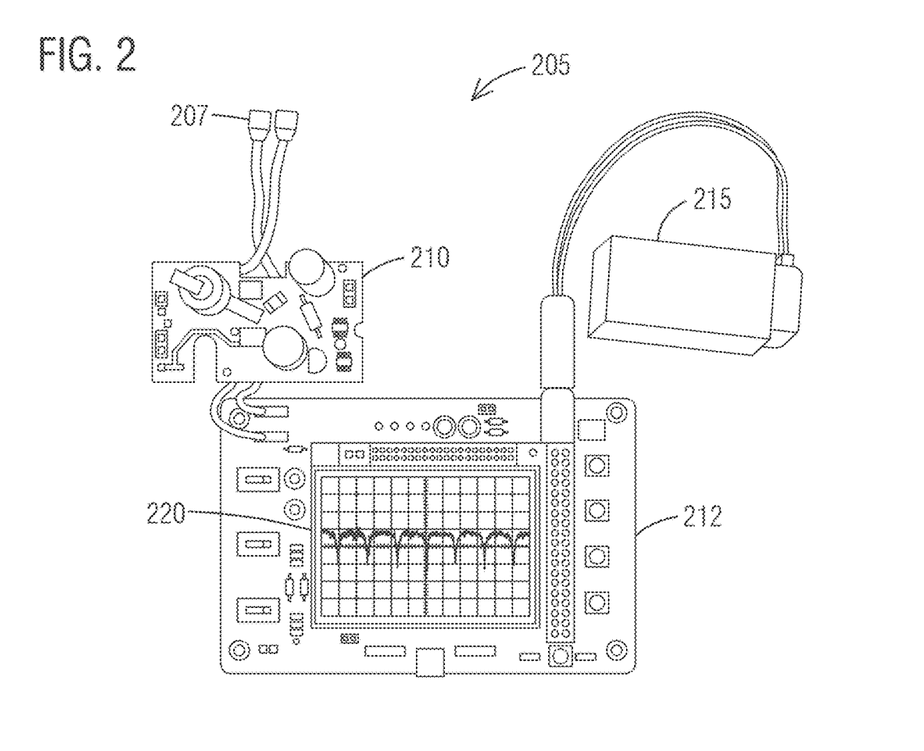
FIG. 2 illustrates hardware components of the arc-like RF noise detector device including a 120V plug, a RF noise coupling circuit, a 1-channel oscilloscope kit and a 9V battery in accordance with an exemplary embodiment of the present invention.

Referring to FIG. 2, it illustrates hardware components of an arc-like RF noise detector device 205 including a 120V plug 207, a RF noise coupling circuit 210, a 1-channel oscilloscope kit 212 and a 9V battery 215 in accordance with an exemplary embodiment of the present invention. The arc-like RF noise detector device 205 describes a device that will display any arc-like RF noise detected on a residential circuit branch. This noise will cause or contribute to AFCI tripping. The arc-like RF noise detector device 205 can be used during AFCI nuisance trip troubleshooting to quickly and easily display the RF noise on whatever branch circuit the device is connected to. The arc-like RF noise detector device 205 is self-contained and small enough to be handheld.

The arc-like RF noise detector device 205 can be either plugged into a 120V outlet or connected via alligator clips to a 120V line. This 120V signal is then analyzed by the RF noise coupling circuit 210 from a residential circuit breaker to generate an RSSI signal. This RSSI signal is then sent to a small oscilloscope 212 to be displayed on its screen 220.

Turning now to FIG. 3, it illustrates a user interface 305 of an arc-like RF noise detector device 307 in accordance with an exemplary embodiment of the present invention. The arc-like RF noise detector device 307 has only two controls: An on/off switch 310 and a pause button 312. The arc-like RF noise detector device 307 is turned on using the on/off switch 310 and can be paused using the pause button 312 to hold a waveform on a display 327. The user interface 305 further includes a three-digit amplitude display 325 to display severity of a detected noise in accordance with an exemplary embodiment of the present invention. The severity of the RF noise on a branch circuit can be determined based on the shape of the displayed waveform (see FIG. 10).

The arc-like RF noise detector device 307 is powered using a 9V battery, which can be accessed from an enclosure 315. The 9V battery may be accessed by opening a battery compartment 320 on the front side of the enclosure 315. The measurement feature of the arc-like RF noise detector device 307 can be turned on or off by pressing and holding the pause button 312.

Figure 4:
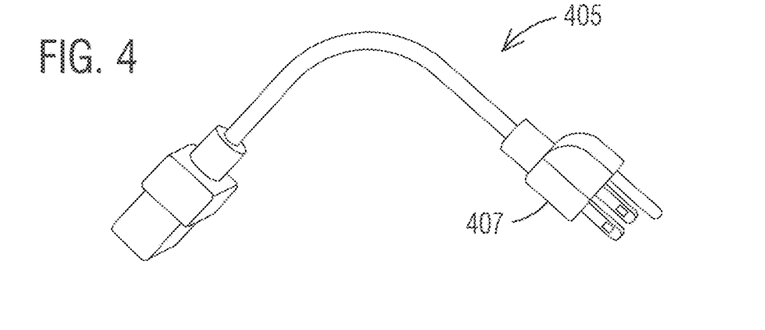
FIG. 4 illustrates a schematic view of a standard power cord in accordance with an exemplary embodiment of the present invention.

FIG. 4 illustrates a schematic view of a standard power cord 405 in accordance with an exemplary embodiment of the present invention. The standard power cord 405 includes a plug 407 to connect to a receptacle on a branch circuit of an arc fault circuit interrupter (AFCI) circuit breaker to detect RF noise. The standard power cord 405 is used to connect the device 307 to a 120V electrical outlet.

Figure 5:
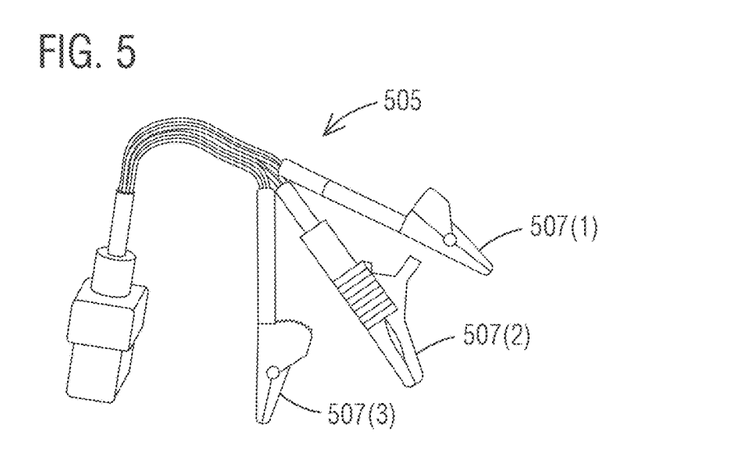
FIG. 5 illustrates a schematic view of a modified power cord in accordance with an exemplary embodiment of the present invention.

As seen in FIG. 5, it illustrates a schematic view of a modified power cord 505 in accordance with an exemplary embodiment of the present invention. The modified power cord 505 includes alligator clips 507(1-3) to connect to wiring on a branch circuit of an arc fault circuit interrupter (AFCI) circuit breaker to detect RF noise. The modified power cord 505 is used to connect the device 307 directly to branch wiring where no outlet is available, such as a lighting circuit. The modified power cord 505 connects to the device 307 via the power entry module 110.

Figure 9:
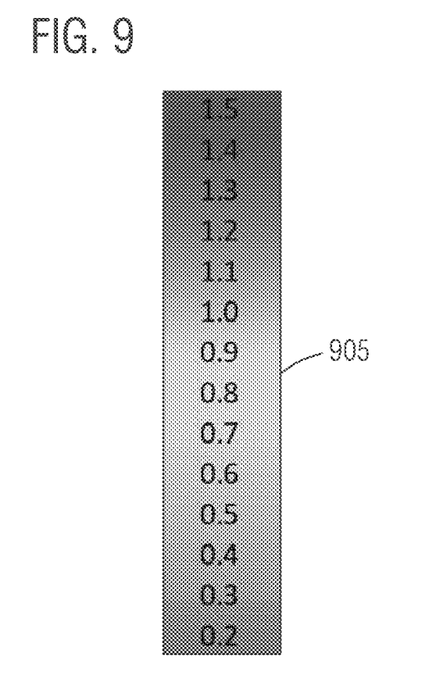
FIG. 9 illustrates a schematic view of a three-digit amplitude display to display severity of a detected noise in accordance with an exemplary embodiment of the present invention.

To measure RF noise the device 307 must be connected to a branch circuit. The primary method of doing this is by plugging into a receptacle on the branch using the standard power cord 405. Alternatively, the device 307 can be connected directly to the branch wiring using the modified power cord 505 with alligator clips 507(1-3). The severity of the RF noise on a branch circuit can be determined based on a shape of the displayed waveform and a noise amplitude displayed on the three-digit amplitude display 325.

Figure 6:
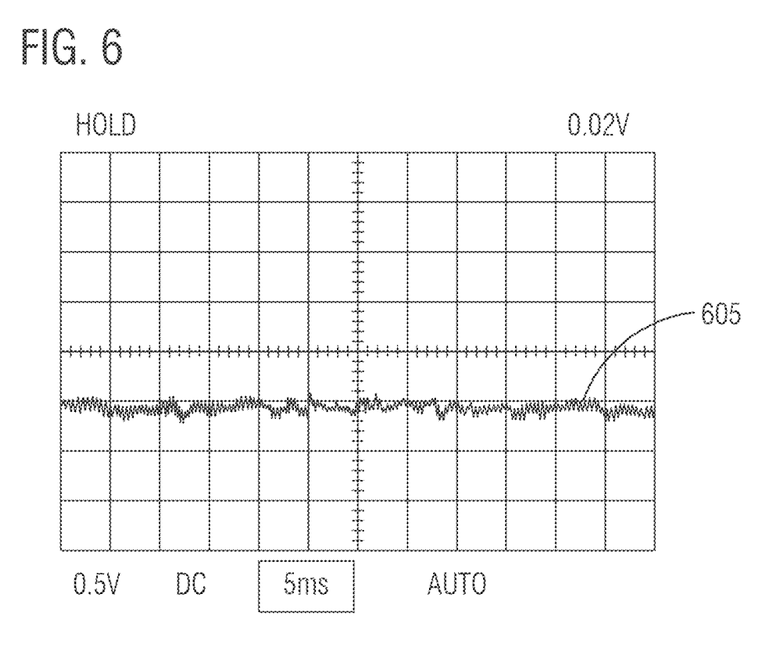
FIG. 6 illustrates a schematic view of a low RF noise waveform on a branch circuit in accordance with an exemplary embodiment of the present invention.
Figure 7:
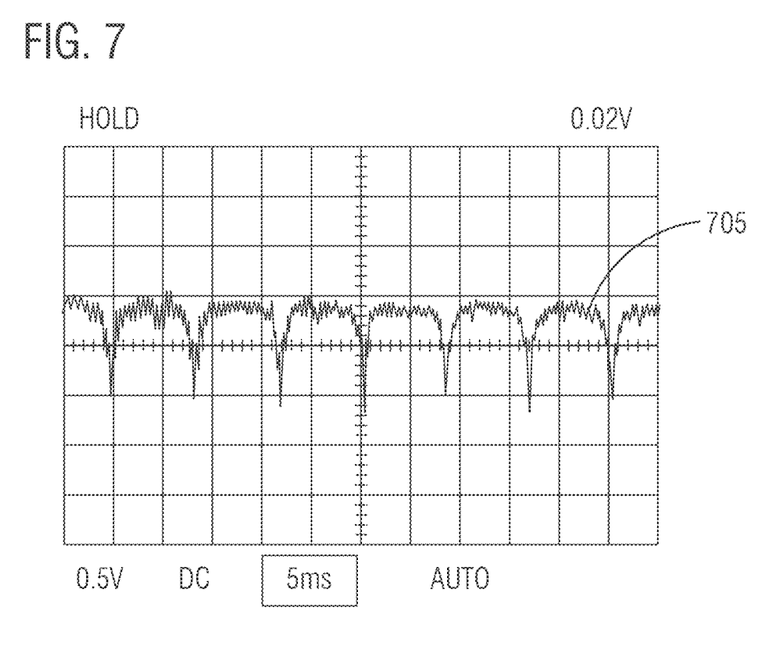
FIG. 7 illustrates a schematic view of a high RF noise waveform on a branch circuit in accordance with an exemplary embodiment of the present invention.
Figure 8:
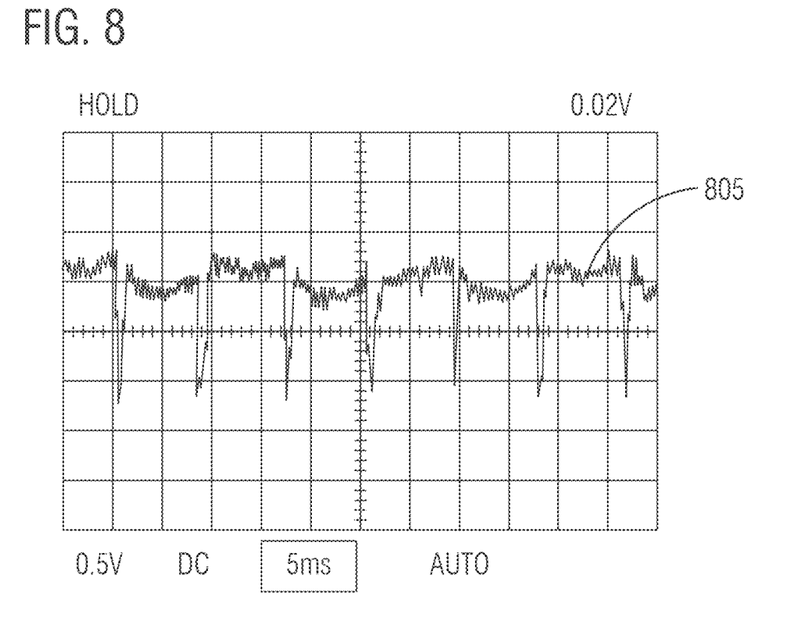
FIG. 8 illustrates a schematic view of a series arc waveform on a branch circuit in accordance with an exemplary embodiment of the present invention.

As shown in FIG. 6, it illustrates a schematic view of a low RF noise waveform 605 on a branch circuit in accordance with an exemplary embodiment of the present invention. In FIG. 7, it illustrates a schematic view of a high RF noise waveform 705 on a branch circuit in accordance with an exemplary embodiment of the present invention. With regard to FIG. 8, it illustrates a schematic view of a series arc waveform 805 on a branch circuit in accordance with an exemplary embodiment of the present invention.

Figure 10:
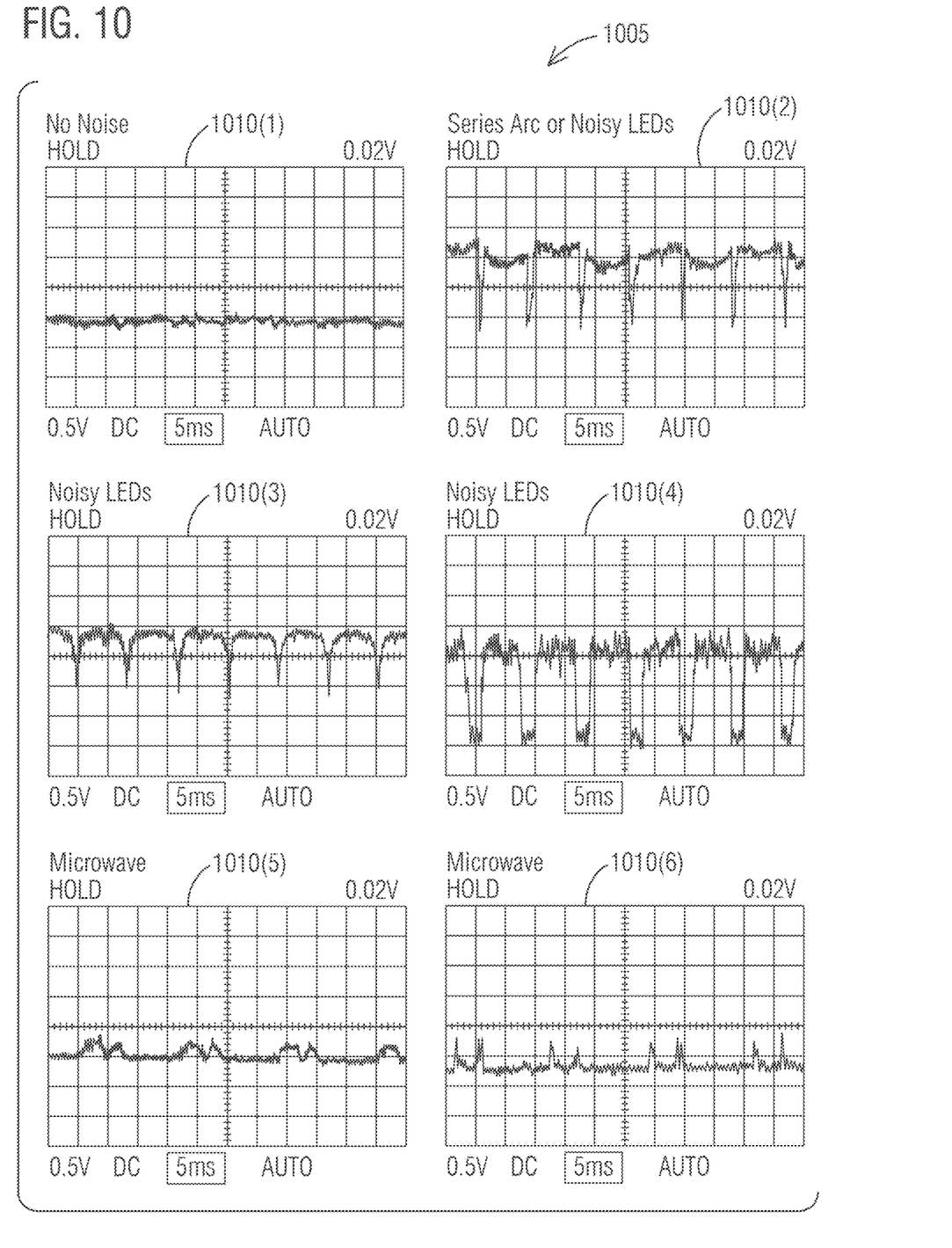
FIG. 10 illustrates a schematic view of a Waveform Reference Sheet in accordance with an exemplary embodiment of the present invention.

With respect to FIG. 9, it illustrates a schematic view of a three-digit amplitude display 905 to display severity of a detected noise in accordance with an exemplary embodiment of the present invention. The severity of the detected noise will be displayed on the three-digit amplitude display 905. This display will indicate a number between 0.2 (low noise) and 1.5 (very high noise). A reading of 0.0 indicates that the Arc Noise Monitor is not connected to the branch being tested FIG. 10 illustrates a schematic view of a Waveform Reference Sheet 1005 in accordance with an exemplary embodiment of the present invention. The shape of the detected noise will be displayed on an LCD Waveform display. This display will give information regarding the severity of the noise, and hints as to the load generating the noise. Some common noise shapes are shown on the Waveform Reference Sheet 1005. The Waveform Reference Sheet 1005 includes a no noise waveform 1010(1), a series arc or noisy LEDs waveform 1010(2), a first noisy LEDs waveform 1010(3), a second noisy LEDs waveform 1010(4), a first microwave waveform 1010(5) and a second microwave waveform 1010(6). The severity of the RF noise on a branch circuit can be determined based on the shape of the displayed waveform on the Waveform Reference Sheet 1005.

Operating Instructions

Slide the Power switch to power OFF/ON the tester. When the tester is powered ON, the LCD display and 3-digit display will be illuminated.

Turn off all the various lights, outlets, appliances, and other devices throughout the area being tested.

Power ON the tester and insert the plug into the outlet on the circuit under test.

If noise is detected and nothing is plugged in or drawing power, then the noise is most likely caused by something upstream of the circuit.

If no noise is detected, begin turning on and off lights and appliances one at a time and observe the displays on the device.

If noise is detected when turning on a light or appliance, make note of what was turned on that generated the noise. You can verify the noise source by turning it off and back on a few times and verifying that the Arc Noise Monitor displays change accordingly.

When a noise source has been identified, make note of its make and model and turn it back off. Continue turning on and off devices until all possible loads at the site have been tested.

The Pause button will hold the most recently displayed waveform on the LCD screen. This is useful if you need to hold the waveform while you unplug the Arc Noise Monitor from an outlet. Note that pausing the device does not hold the Amplitude readout, only the noise waveform on the LCD screen.

For some common noise shapes that might be seen on the display see the waveform reference sheet included with a user manual.

While an arc-like RF noise detector device or an Arc Noise Monitor as a simple diagnostic or monitoring tool or tester is described here a range of one or more other types of troubleshooters of nuisance tripping of an arc fault circuit interrupter (AFCI) circuit breaker or other forms of troubleshooters are also contemplated by the present invention. For example, other types of troubleshooters may be implemented based on one or more features presented above without deviating from the spirit of the present invention.

The techniques described herein can be particularly useful for an arc fault circuit interrupter (AFCI) circuit breaker. While particular embodiments are described in terms of specific configuration of an arc fault circuit interrupter (AFCI) circuit breaker, the techniques described herein are not limited to such a limited configuration but can also be used with other configurations and types of circuit breakers.

While embodiments of the present invention have been disclosed in exemplary forms, it will be apparent to those skilled in the art that many modifications, additions, and deletions can be made therein without departing from the spirit and scope of the invention and its equivalents, as set forth in the following claims.

Embodiments and the various features and advantageous details thereof are explained more fully with reference to the non-limiting embodiments that are illustrated in the accompanying drawings and detailed in the following description. Descriptions of well-known starting materials, processing techniques, components and equipment are omitted so as not to unnecessarily obscure embodiments in detail. It should be understood, however, that the detailed description and the specific examples, while indicating preferred embodiments, are given by way of illustration only and not by way of limitation. Various substitutions, modifications, additions and/or rearrangements within the spirit and/or scope of the underlying inventive concept will become apparent to those skilled in the art from this disclosure.

As used herein, the terms "comprises," "comprising," "includes," "including," "has," "having" or any other variation thereof, are intended to cover a non-exclusive inclusion. For example, a process, article, or apparatus that comprises a list of elements is not necessarily limited to only those elements but may include other elements not expressly listed or inherent to such process, article, or apparatus.

Additionally, any examples or illustrations given herein are not to be regarded in any way as restrictions on, limits to, or express definitions of, any term or terms with which they are utilized. Instead, these examples or illustrations are to be regarded as being described with respect to one particular embodiment and as illustrative only. Those of ordinary skill in the art will appreciate that any term or terms with which these examples or illustrations are utilized will encompass other embodiments which may or may not be given therewith or elsewhere in the specification and all such embodiments are intended to be included within the scope of that term or terms.

In the foregoing specification, the invention has been described with reference to specific embodiments. However, one of ordinary skill in the art appreciates that various modifications and changes can be made without departing from the scope of the invention. Accordingly, the specification and figures are to be regarded in an illustrative rather than a restrictive sense, and all such modifications are intended to be included within the scope of invention.

Although the invention has been described with respect to specific embodiments thereof, these embodiments are merely illustrative, and not restrictive of the invention. The description herein of illustrated embodiments of the invention is not intended to be exhaustive or to limit the invention to the precise forms disclosed herein (and in particular, the inclusion of any particular embodiment, feature or function is not intended to limit the scope of the invention to such embodiment, feature or function). Rather, the description is intended to describe illustrative embodiments, features and functions in order to provide a person of ordinary skill in the art context to understand the invention without limiting the invention to any particularly described embodiment, feature or function. While specific embodiments of and examples for, the invention are described herein for illustrative purposes only, various equivalent modifications are possible within the spirit and scope of the invention, as those skilled in the relevant art will recognize and appreciate. As indicated, these modifications may be made to the invention in light of the foregoing description of illustrated embodiments of the invention and are to be included within the spirit and scope of the invention. Thus, while the invention has been described herein with reference to particular embodiments thereof, a latitude of modification, various changes and substitutions are intended in the foregoing disclosures, and it will be appreciated that in some instances some features of embodiments of the invention will be employed without a corresponding use of other features without departing from the scope and spirit of the invention as set forth. Therefore, many modifications may be made to adapt a particular situation or material to the essential scope and spirit of the invention.

Respective appearances of the phrases "in one embodiment," "in an embodiment," or "in a specific embodiment" or similar terminology in various places throughout this specification are not necessarily referring to the same embodiment. Furthermore, the particular features, structures, or characteristics of any particular embodiment may be combined in any suitable manner with one or more other embodiments. It is to be understood that other variations and modifications of the embodiments described and illustrated herein are possible in light of the teachings herein and are to be considered as part of the spirit and scope of the invention.

In the description herein, numerous specific details are provided, such as examples of components and/or methods, to provide a thorough understanding of embodiments of the invention. One skilled in the relevant art will recognize, however, that an embodiment may be able to be practiced without one or more of the specific details, or with other apparatus, systems, assemblies, methods, components, materials, parts, and/or the like. In other instances, well-known structures, components, systems, materials, or operations are not specifically shown or described in detail to avoid obscuring aspects of embodiments of the invention. While the invention may be illustrated by using a particular embodiment, this is not and does not limit the invention to any particular embodiment and a person of ordinary skill in the art will recognize that additional embodiments are readily understandable and are a part of this invention.

It will also be appreciated that one or more of the elements depicted in the drawings/figures can also be implemented in a more separated or integrated manner, or even removed or rendered as inoperable in certain cases, as is useful in accordance with a particular application.

Benefits, other advantages, and solutions to problems have been described above with regard to specific embodiments. However, the benefits, advantages, solutions to problems, and any component(s) that may cause any benefit, advantage, or solution to occur or become more pronounced are not to be construed as a critical, required, or essential feature or component.

What is claimed is:

1. An arc-like radio frequency (RF) noise detector device comprising:
a power cord with a plug to connect to a receptacle on a branch circuit of the arc fault circuit interrupter (AFCI) circuit breaker to detect RF noise;
a RF noise coupling circuit to receive power from a power entry module and coupled to an Application Specific Integrated Circuit (ASIC) to generate a Received Signal Strength Indicator (RSSI) signal from the detected RF noise;
a power supply to receive power from the power entry module to power the ASIC;
a signal display device configured to receive and display the RSSI signal on a display screen to determine nature of a breaker trip event or likelihood of the breaker trip event;
a battery to power the signal display device; and
an amplitude display configured to display a severity of a detected RF noise,
wherein the signal display device is a 1-channel oscilloscope kit to determine if the breaker trip event is caused by an actual arc or by noise generated from a household appliance, and
wherein the arc-like radio frequency (RF) noise detector device to detect and display RF noise on a residential circuit branch that cause or contribute to an arc fault circuit interrupter (AFCI) circuit breaker tripping and the amplitude display to display an amplitude display data to display the severity of the detected RF noise for enabling interpretation of all the data by a user for diagnosis of an AFCI trip event rather than interpretation by a detection algorithm interpreting data.

2. The arc-like radio frequency (RF) noise detector device of claim 1, wherein the RF noise coupling circuit is similar to that of a residential circuit breaker.

3. The arc-like radio frequency (RF) noise detector device of claim 1, wherein the signal display device has only two controls: Off/On and Pause.

4. The arc-like radio frequency (RF) noise detector device of claim 1, wherein the battery is capable of supplying 8V to 12V DC power.

5. The arc-like radio frequency (RF) noise detector device of claim 1, wherein the battery is an AC to DC power supply capable of providing 8V to 12V DC power.

6. The arc-like radio frequency (RF) noise detector device of claim 1, wherein the power supply is a 120V AC to 5V DC power supply.

7. The arc-like radio frequency (RF) noise detector device of claim 3, wherein the severity of the detected RF noise on the residential circuit branch can be determined based on a shape of a displayed waveform on a Waveform Reference Sheet.

8. The arc-like radio frequency (RF) noise detector device of claim 1, wherein the RF noise coupling circuit, the ASIC and the power supply form a Combination Arc Fault Circuit Interrupter (CAFCI) RSSI circuit.

9. The arc-like radio frequency (RF) noise detector device of claim 1, wherein a first output of the ASIC is coupled to a voltage meter.

10. The arc-like radio frequency (RF) noise detector device of claim 9, wherein a second output of the ASIC is coupled to the signal display device.

11. An arc-like radio frequency (RF) noise detector device comprising:
a power cord with alligator clips to connect to wiring on a branch circuit of the arc fault circuit interrupter (AFCI) circuit breaker to detect RF noise;
a RF noise coupling circuit to receive power from a power entry module and coupled to an Application Specific Integrated Circuit (ASIC) to generate a Received Signal Strength Indicator (RSSI) signal from the detected RF noise;
a power supply to receive power from the power entry module to power the ASIC;
a signal display device configured to receive and display the RSSI signal on a display screen to determine nature of a breaker trip event or likelihood of the breaker trip event;
a battery to power the signal display device; and
an amplitude display configured to display a severity of a detected RF noise,
wherein the signal display device is a 1-channel oscilloscope kit to determine if the breaker trip event is caused by an actual arc or by noise generated from a household appliance, and
wherein the arc-like radio frequency (RF) noise detector device to detect and display RF noise on a residential circuit branch that cause or contribute to an arc fault circuit interrupter (AFCI) circuit breaker tripping and the amplitude display to display an amplitude display data to display the severity of the detected RF noise for enabling interpretation of all the data by a user for diagnosis of an AFCI trip event rather than interpretation by a detection algorithm interpreting data.

12. The arc-like radio frequency (RF) noise detector device of claim 11, wherein the RF noise coupling circuit is similar to that of a residential circuit breaker.

13. The arc-like radio frequency (RF) noise detector device of claim 11, wherein the signal display device has only two controls: Off/On and Pause.

14. The arc-like radio frequency (RF) noise detector device of claim 11, wherein the battery is capable of supplying 8V to 12V DC power.

15. The arc-like radio frequency (RF) noise detector device of claim 11, wherein the battery is an AC to DC power supply capable of providing 8V to 12V DC power.

16. The arc-like radio frequency (RF) noise detector device of claim 11, wherein the power supply is a 120V AC to 5V DC power supply.

17. The arc-like radio frequency (RF) noise detector device of claim 13, wherein the severity of the detected RF noise on the residential circuit branch can be determined based on a shape of a displayed waveform on a Waveform Reference Sheet.

18. The arc-like radio frequency (RF) noise detector device of claim 11, wherein the RF noise coupling circuit, the ASIC and the power supply form a Combination Arc Fault Circuit Interrupter (CAFCI) RSSI circuit.

19. The arc-like radio frequency (RF) noise detector device of claim 11, wherein a first output of the ASIC is coupled to a voltage meter.

20. The arc-like radio frequency (RF) noise detector device of claim 19, wherein a second output of the ASIC is coupled to the signal display device.

* * * * *